United States Patent
Kim et al.

(10) Patent No.: US 12,543,424 B2
(45) Date of Patent: Feb. 3, 2026

(54) SOLAR CELL AND MANUFACTURING METHOD THEREFOR

(71) Applicant: JUSUNG ENGINEERING CO., LTD., Gwangju-si (KR)

(72) Inventors: Jae Ho Kim, Gwangju-si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 121 days.

(21) Appl. No.: 18/554,991

(22) PCT Filed: Apr. 4, 2022

(86) PCT No.: PCT/KR2022/004772
§ 371 (c)(1),
(2) Date: Oct. 11, 2023

(87) PCT Pub. No.: WO2022/220456
PCT Pub. Date: Oct. 20, 2022

(65) Prior Publication Data
US 2024/0204117 A1 Jun. 20, 2024

(30) Foreign Application Priority Data
Apr. 12, 2021 (KR) .......... 10-2021-0047006

(51) Int. Cl.
*H10K 30/80* (2023.01)
*H10F 10/164* (2025.01)
(Continued)

(52) U.S. Cl.
CPC .......... *H10K 30/80* (2023.02); *H10F 10/164* (2025.01); *H10F 77/127* (2025.01);
(Continued)

(58) Field of Classification Search
CPC ........ H10K 30/80; H10K 30/50; H10K 39/15; H10K 85/50; H10K 30/81; H10K 30/87;
(Continued)

(56) References Cited

U.S. PATENT DOCUMENTS

2015/0059842 A1* 3/2015 Bae .......... H10F 19/37
136/256
2015/0249170 A1 9/2015 Snaith et al.
(Continued)

FOREIGN PATENT DOCUMENTS

CN 111554764 A 8/2020
JP 2004214442 A 7/2004
(Continued)

OTHER PUBLICATIONS

Chistiakova, Ganna, "Development of metal oxide thin films as carrier selective contacts for silicon heterojunction solar cells", Technical University Berlin, Doctoral Thesis, 2020.
(Continued)

*Primary Examiner* — Angelo Trivisonno
(74) *Attorney, Agent, or Firm* — Renaissance IP Law Group LLP

(57) ABSTRACT

The present inventive concept provides a solar cell and a manufacturing method therefor, the solar cell comprising: a semiconductor substrate; a first transparent electrode layer provided on one surface of the semiconductor substrate; and a first electrode provided on one surface of the first transparent electrode layer, wherein the first electrode comprises a first pattern layer pattern-formed through a deposition process using a shadow mask.

14 Claims, 7 Drawing Sheets

(51) Int. Cl.
*H10F 77/12* (2025.01)
*H10F 77/20* (2025.01)
*H10F 77/30* (2025.01)
*H10K 30/50* (2023.01)
*H10K 39/15* (2023.01)
*H10K 85/50* (2023.01)

(52) U.S. Cl.
CPC ......... *H10F 77/211* (2025.01); *H10F 77/244* (2025.01); *H10F 77/334* (2025.01); *H10K 30/50* (2023.02); *H10K 39/15* (2023.02); *H10K 85/50* (2023.02)

(58) Field of Classification Search
CPC ..... H10K 30/15; H10F 10/164; H10F 77/127; H10F 77/211; H10F 77/244; H10F 77/334; H10F 10/166; H10F 10/19; H10F 77/1662; H10F 77/247; H10F 10/148; H10F 71/121; Y02E 10/549; Y02E 10/548; Y02P 70/50; C23C 14/042; C23C 14/086; C23C 16/042; C23C 16/407
See application file for complete search history.

(56) References Cited

U.S. PATENT DOCUMENTS

| | | | |
|---|---|---|---|
| 2016/0126370 A1 | 5/2016 | Adachi | |
| 2016/0126401 A1 | 5/2016 | Iannelli et al. | |

FOREIGN PATENT DOCUMENTS

| | | | |
|---|---|---|---|
| JP | 2005268239 A | 9/2005 | |
| JP | 2011070902 A | 4/2011 | |
| JP | 2014229633 A | 12/2014 | |
| JP | 2014236066 A | 12/2014 | |
| JP | 2018011058 A | 1/2018 | |
| JP | 6524150 B2 | 6/2019 | |
| JP | 2019091882 A | 6/2019 | |
| KR | 20120035756 A | 4/2012 | |
| KR | 20130022296 A | 3/2013 | |
| KR | 20140109840 A | 9/2014 | |
| KR | 20180063866 A | 6/2018 | |
| KR | 20190016927 A | 2/2019 | |
| KR | 20190062350 A | 6/2019 | |
| TW | 200913297 A | 3/2009 | |
| TW | 200952184 A | 12/2009 | |
| WO | 2017057646 A1 | 4/2017 | |
| WO | 2019200327 A1 | 10/2019 | |
| WO | 2023161798 A1 | 8/2023 | |

OTHER PUBLICATIONS

Li, Zijia et al., "Wide-Bandgap Perovskite/Gallium Arsenide Tandem Solar Cells", Advanced Energy Materials, vol. 10, Issue 6, Feb. 11, 2020.

Niesen, Bjoern et al., "High-efficiency perovskite/silicon heterojunction tandem solar cells", 2016 IEEE 43rd Photovoltaic Specialists Conference (PVSC), Portland, OR, USA, pp. 0077-0081, Jun. 5-10, 2016.

Seok, Hae-Jun et al., "ZnO: Ga-graded ITO electrodes to control interface between PCBM and ITO in planar perovskite solar cells", Science and Technology of Advanced Materials, vol. 20, Issue 1, pp. 389-400, Apr. 25, 2019.

International Search Report for PCT/KR2022/004772, mailed Jul. 6, 2022.

European Extended Search Report for Application No. 22788312.1, mailed Jun. 10, 2025.

* cited by examiner

SOLAR CELL AND MANUFACTURING METHOD THEREFOR

TECHNICAL FIELD

The present inventive concept relates to a solar cell, and particularly, to an electrode of a solar cell.

BACKGROUND ART

A solar cell includes a semiconductor layer and an electrode, which are provided on a substrate.

For example, a solar cell of the related art includes an n-type semiconductor layer formed on one surface of a semiconductor substrate, a p-type semiconductor layer formed on the other surface of the semiconductor substrate, and an electrode formed on each of the p-type semiconductor layer and the n-type semiconductor layer.

In this case, in the related art, the electrode is formed through a photolithography process, and due to this, there is a problem where a manufacturing process is complicated and productivity is reduced.

DISCLOSURE

Technical Problem

The present inventive concept is devised to solve the above-described problem and is for providing a solar cell and a method of manufacturing the same, in which an electrode may be formed through a shadow mask process instead of a photolithography process.

Technical Solution

To accomplish the above-described objects, the present inventive concept provides a solar cell including: a semiconductor substrate; a first transparent electrode layer provided on one surface of the semiconductor substrate; and a first electrode provided on one surface of the first transparent electrode layer, wherein the first electrode includes a first pattern layer patterned by a deposition process using a shadow mask.

Each of the first transparent electrode layer and the first pattern layer may include transparent oxide including at least one of indium (In) and tin (Sn).

The first pattern layer may contact the first transparent electrode layer, and a content of indium of the first pattern layer may be higher than a content of indium of the first transparent electrode layer.

The first pattern layer may contact the first transparent electrode layer, and a content of oxygen of the first pattern layer may be lower than a content of oxygen of the first transparent electrode layer.

The first electrode may further include a first seed layer provided on the first pattern layer and a first metal layer provided on the first seed layer, the first seed layer may be patterned by a deposition process using a shadow mask, and the first metal layer may be patterned by a selective deposition process.

The first pattern layer, the first seed layer, and the first metal layer may have the same pattern.

A first semiconductor layer and a second semiconductor layer may be further provided between the semiconductor substrate and the first transparent electrode layer, the first semiconductor layer may be formed of an intrinsic amorphous silicon layer, and the second semiconductor layer may be formed of an n-type amorphous silicon layer.

The solar cell may further include a perovskite solar cell provided between the first transparent electrode layer and the first pattern layer, wherein the perovskite solar cell may include a first conductive charge transporting layer, a light absorption layer provided on the first conductive charge transporting layer, and a second conductive charge transporting layer provided on the light absorption layer.

The solar cell may further include a third transparent electrode layer provided between the second conductive charge transporting layer and the first pattern layer, wherein the third transparent electrode layer may include transparent oxide including at least one of indium (In) and tin (Sn), the first pattern layer may contact the third transparent electrode layer, a content of indium of the first pattern layer may be higher than a content of indium of the third transparent electrode layer, and a content of oxygen of the first pattern layer may be lower than a content of oxygen of the third transparent electrode layer.

Moreover, the present inventive concept provides a solar cell including: a perovskite solar cell including a first conductive charge transporting layer, a light absorption layer provided on the first conductive charge transporting layer, and a second conductive charge transporting layer provided on the light absorption layer; and a first electrode provided on one surface of the second conductive charge transporting layer, wherein the first electrode includes a first pattern layer patterned by a deposition process using a shadow mask.

The solar cell may further include a third transparent electrode layer provided between the second conductive charge transporting layer and the first pattern layer, wherein each of the third transparent electrode layer and the first pattern layer may include transparent oxide including at least one of indium (In) and tin (Sn).

The first pattern layer may contact the third transparent electrode layer, a content of indium of the first pattern layer may be higher than a content of indium of the third transparent electrode layer, and a content of oxygen of the first pattern layer may be lower than a content of oxygen of the third transparent electrode layer.

Moreover, the present inventive concept provides a method of manufacturing a solar cell, the method including: a step of forming a first transparent electrode layer on one surface of a semiconductor substrate; and a step of forming a first electrode on one surface of the first transparent electrode layer, wherein the step of forming the first electrode may include a process of forming a first pattern layer through a deposition process using a shadow mask, and the first transparent electrode layer and the first pattern layer are formed by a continuous process in-situ.

Each of the first transparent electrode layer and the first pattern layer may include transparent oxide including at least one of indium (In) and tin (Sn).

A process of forming the first transparent electrode layer and the first pattern layer through a continuous process in-situ may include a process of forming the first transparent electrode layer by supplying a material including Sn, a material including oxygen, and a material including indium in the same chamber, and then, forming the first pattern layer with the shadow mask by supplying the material including Sn, the material including oxygen (O), and the material including indium.

A ratio of an amount of supplying the material including indium to an amount of supplying all materials in the process of forming the first pattern layer may be higher than a ratio of an amount of supplying the material including indium to an amount of supplying all materials in the process of forming the first transparent electrode layer, and a ratio of an amount of supplying the material including oxygen to an amount of supplying all materials in the process of forming the first pattern layer may be lower than a ratio of an amount of supplying the material including oxygen to an amount of supplying all materials in the process of forming the first transparent electrode layer.

A process of forming the first transparent electrode layer and the first pattern layer through a continuous process in-situ may include a process of forming the first transparent electrode layer by supplying a material including Sn and a material including oxygen in the same chamber, and then, forming the first pattern layer with the shadow mask by supplying the material including Sn, the material including oxygen (O), and a material including indium.

Moreover, the present inventive concept provides a method of manufacturing a solar cell, the method including: a step of forming a perovskite solar cell on one surface of a semiconductor substrate, the perovskite solar cell including a first conductive charge transporting layer, a light absorption layer provided on the first conductive charge transporting layer, and a second conductive charge transporting layer provided on the light absorption layer; and a step of forming a third transparent electrode layer on one surface of the second conductive charge transporting layer; and a step of forming a first electrode on one surface of the third transparent electrode layer, wherein the step of forming the first electrode includes a process of forming a first pattern layer through a deposition process using a shadow mask, and the third transparent electrode layer and the first pattern layer are formed by a continuous process in-situ.

Each of the third transparent electrode layer and the first pattern layer may include transparent oxide including at least one of indium (In) and tin (Sn).

The step of forming the first electrode may include a process of forming a first seed layer on the first pattern layer and a process of forming a first metal layer on the first seed layer, the first seed layer may be patterned by a deposition process using a shadow mask, and the first metal layer may be patterned by a selective deposition process.

Advantageous Effect

According to the present inventive concept, the following effects may be realized.

According to an embodiment of the present inventive concept, because a first electrode including a first pattern layer is formed on a first transparent electrode layer, the first pattern layer may be formed through a shadow mask process instead of a photolithography process, and thus, a manufacturing process may be simple and productivity may be enhanced.

Particularly, the first transparent electrode layer and the first pattern layer may be formed by a continuous process in-situ, and thus, productivity may be more enhanced.

MODE FOR INVENTION

Figure 1:
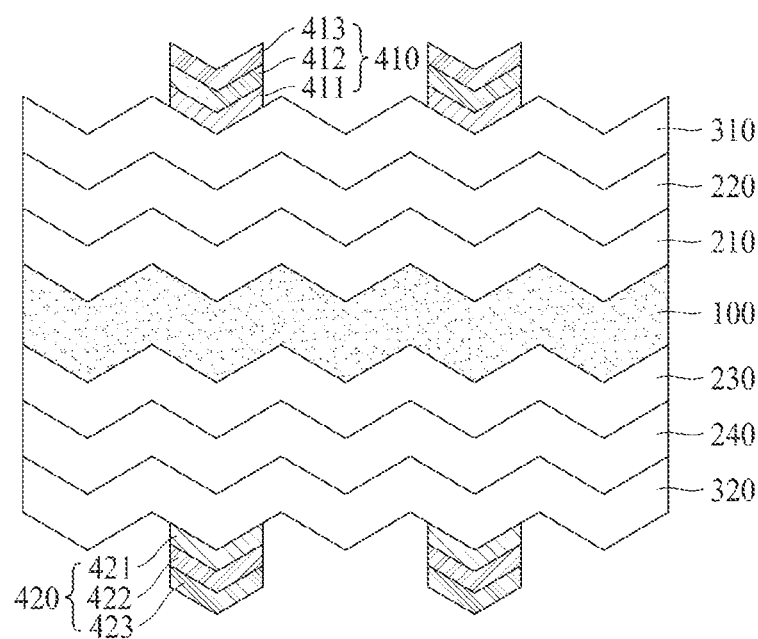
FIG. 1 is a cross-sectional view of a solar cell according to an embodiment of the present inventive concept.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this invention will be thorough and complete, and will fully convey the scope of the present inventive concept to those skilled in the art. Furthermore, the present inventive concept is only defined by scopes of claims.

A shape, a size, a ratio, an angle, and a number disclosed in the drawings for describing embodiments of the present inventive concept are merely an example, and thus, the present inventive concept is not limited to the illustrated details. Like reference numerals refer to like elements throughout. In the following description, when the detailed description of the relevant known technology is determined to unnecessarily obscure the important point of the present inventive concept, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept.

Features of various embodiments of the present inventive concept may be partially or overall coupled to or combined with each other, and may be variously inter-operated with each other and driven technically as those skilled in the art can sufficiently understand. The embodiments of the present inventive concept may be carried out independently from each other, or may be carried out together in co-dependent relationship.

Hereinafter, preferable embodiments of the present inventive concept will be described in detail with reference to the accompanying drawings.

FIG. 1 is a cross-sectional view of a solar cell according to an embodiment of the present inventive concept.

As seen in FIG. 1, the solar cell according to an embodiment of the present inventive concept includes a semiconductor substrate 100, a first semiconductor layer 210, a second semiconductor layer 220, a third semiconductor layer 230, a fourth semiconductor layer 240, a first transparent electrode layer 310, a second transparent electrode layer 320, a first electrode 410, and a second electrode 420.

The semiconductor substrate 100 may include an N-type semiconductor wafer. One surface and the other surface (in detail, a top surface and a bottom surface) of the semiconductor substrate 100 may be formed in a concave-convex structure. Therefore, a plurality of layers stacked on the one surface of the semiconductor substrate 100 and a plurality of layers stacked on the other surface of the semiconductor substrate 100 may be formed in a concave-convex structure corresponding to the concave-convex structure of the semiconductor substrate 100. However, a concave-convex structure may be formed in only one of the one surface and the other surface of the semiconductor substrate 100, or a concave-convex structure may not be formed in all of the one surface and the other surface of the semiconductor substrate 100.

The first semiconductor layer 210 is formed on the one surface (for example, the top surface) of the semiconductor substrate 100. The first semiconductor layer 210 may be formed through a thin film deposition process such as a chemical vapor deposition (CVD) process or an atomic layer deposition (ALD) process and may be formed of an intrinsic semiconductor layer (for example, an intrinsic amorphous silicon layer). However, depending on the case, the first semiconductor layer 210 may be formed of a semiconductor layer doped with a small amount of dopant (for example, a small amount of n-type dopant), and for example, may be formed of an amorphous silicon layer doped with a small amount of n-type dopant.

The second semiconductor layer 220 is formed on one surface (for example, a top surface) of the first semiconductor layer 210. The second semiconductor layer 220 may be formed through a thin film deposition process and may be formed of, for example, an n-type semiconductor layer having the same polarity as that of the semiconductor substrate 100 or the first semiconductor layer 210. The second semiconductor layer 220 may be formed of an n-type amorphous silicon layer.

The third semiconductor layer 230 is formed on the other surface (for example, the bottom surface) of the semiconductor substrate 100. The third semiconductor layer 230 may be formed through a thin film deposition process and may be formed of an intrinsic semiconductor layer (for example, an intrinsic amorphous silicon layer). However, depending on the case, the third semiconductor layer 230 may be formed of an amorphous silicon layer doped with a small amount of dopant (for example, a small amount of p-type dopant). In this case, a polarity of a dopant doped on the third semiconductor layer 230 is opposite to that of a dopant doped on the first semiconductor layer 210.

The fourth semiconductor layer 240 is formed on the other surface (for example, a bottom surface) of the third semiconductor layer 230. The fourth semiconductor layer 240 may be formed through a thin film deposition process and may be formed of a semiconductor layer doped with a certain dopant. In this case, a polarity of a dopant doped on the fourth semiconductor layer 240 is opposite to that of a dopant doped on the second semiconductor layer 220. The fourth semiconductor layer 240 may be formed of a p-type amorphous silicon layer.

The first transparent electrode layer 310 is formed on one surface (for example, a top surface) of the second semiconductor layer 220. The first transparent electrode layer 310 is formed through a thin film deposition process such as a CVD process, an ALD process, or a physical vapor deposition (PVD) process. The first transparent electrode layer 310 may be formed of transparent oxide (for example, indium tin oxide (ITO) or $SnO_2$) including at least one of indium and tin.

The second transparent electrode layer 320 is formed on the other surface (for example, a bottom surface) of the fourth semiconductor layer 240. The second transparent electrode layer 320 is formed through a thin film deposition process such as a CVD process, an ALD process, or a PVD process. The second transparent electrode layer 320 may be formed of transparent oxide (for example, ITO or $SnO_2$) including at least one of indium and tin. The second transparent electrode layer 320 may be formed of the same material as that of the first transparent electrode layer 310.

The first electrode 410 is formed on one surface (for example, a top surface) of the first transparent electrode layer 310. In detail, the first electrode 410 is formed on an incident surface on which sunlight is incident, and thus, is patterned in a certain shape so as to prevent the amount of incident sunlight from being reduced by the first electrode 410. The first electrode 410 may be formed in a concave-convex structure. Accordingly, a plurality of layers included in the first electrode 410 may be stacked in a concave-convex structure. However, the first electrode 410 is not limited thereto and may not be formed in a concave-convex structure.

The first electrode 410 may include a first pattern layer 411, a first seed layer 412, and a first metal layer 413.

The first pattern layer 411 may be formed on one surface (for example, a top surface) of the first transparent electrode layer 310.

The first pattern layer 411 may be formed of transparent oxide (for example, ITO or $SnO_2$) including at least one of indium and tin.

The first pattern layer 411 may be formed through a thin film deposition process such as a CVD process, an ALD process, or a PVD process, and in this case, may be patterned by the thin film deposition process using a shadow mask. Therefore, the first transparent electrode layer 310 may be first formed by the thin film deposition process without the shadow mask, and then, the first pattern layer 411 may be formed by the thin film deposition process using a shadow mask in-situ. That is, the first transparent electrode layer 310 and the first pattern layer 411 may be formed by a continuous process in-situ.

In this case, a content of indium of the first pattern layer 411 may be higher than a content of indium of the first transparent electrode layer 310, and a content of oxygen of the first pattern layer 411 may be lower than a content of oxygen of the first transparent electrode layer 310.

When a content of indium of the first pattern layer 411 is higher than a content of indium of the first transparent electrode layer 310 and a content of oxygen of the first pattern layer 411 is lower than a content of oxygen of the first transparent electrode layer 310, the electrical conductivity of the first pattern layer 411 may be better than that of the first transparent electrode layer 310, and thus, a contact resistance between the first transparent electrode layer 310 and the first seed layer 412 may be reduced.

Moreover, when a content of indium of the first transparent electrode layer 310 is lower than a content of indium of the first pattern layer 411 and a content of oxygen of the first transparent electrode layer 310 is higher than a content of oxygen of the first pattern layer 411, a light transmittance of the first transparent electrode layer 310 may be better than that of the first pattern layer 411, the amount of sunlight incident on the inside of a solar cell may increase.

The first seed layer 412 may be formed on one surface (for example, a top surface) of the first pattern layer 411.

The first seed layer 412 may include a conductive material (for example, at least one selected from the group consisting of indium (In), tin (Sn), tantalum (Ta), and zinc (Zn)).

The first seed layer 412 is formed through a thin film deposition process such as a CVD process, an ALD process, or a PVD process. Also, the first seed layer 412 may be formed to have the same pattern as that of the first pattern layer 411 through the thin film deposition process using a shadow mask. In this case, the first seed layer 412 may be formed by a continuous process in-situ as the first pattern layer 411, and for the process efficiency of the continuous process, it may be preferable that the first seed layer 412 includes a material (for example, indium (In) or tin (Sn)) which is the same as a material included in the first pattern layer 411.

The first metal layer 413 may be formed on one surface (for example, a top surface) of the first seed layer 412.

The first metal layer 413 may be formed of various metal materials known to those skilled in the art, and preferably, may include at least one selected from the group consisting of tungsten (W), aluminum (Al), and copper (Cu).

The first metal layer 413 is formed through a thin film deposition process such as a CVD process, an ALD process, or a PVD process. Also, the first metal layer 413 may be formed by the thin film deposition process using a shadow mask, or may be formed by a selective deposition process known to those skilled in the art without a shadow mask. In a case where the first metal layer 413 is formed by the thin film deposition process using a shadow mask, the first metal layer 413 may be formed by a continuous process in-situ as the first seed layer 412. The first metal layer 413 may be formed to have the same pattern as that of the first seed layer 412.

Depending on the case, the first seed layer 412 and the first metal layer 413 may be omitted, and in this case, the first electrode 410 may be formed of the first pattern layer 411.

The second electrode 420 is formed on the other surface (for example, a bottom surface) of the second transparent electrode layer 320. The second electrode 420 may be formed on a surface opposite to an incident surface on which sunlight is incident, and thus, may be formed on a whole bottom surface of the second transparent electrode layer 320. However, like the first electrode 410 described above, the second electrode 420 may be patterned in a certain shape, and thus, may be configured so that reflected light of sunlight is incident on the inside of the solar cell through the second transparent electrode layer 320. The second electrode 420 may be formed in a concave-convex structure. Accordingly, a plurality of layers included in the second electrode 420 may be stacked in a concave-convex structure. However, the second electrode 420 is not limited thereto and may not be formed in a concave-convex structure.

The second electrode 420 may include a second pattern layer 421, a second seed layer 422, and a second metal layer 423.

The second pattern layer 421 may be formed on the other surface (for example, a bottom surface) of the second transparent electrode layer 320.

The second pattern layer 421, like the second transparent electrode layer 320, may be formed of transparent oxide (for example, ITO or $SnO_2$) including at least one of indium and tin.

The second pattern layer 421 may be formed through a thin film deposition process such as a CVD process, an ALD process, or a PVD process, and in this case, may be patterned by the thin film deposition process using a shadow mask. Therefore, the second transparent electrode layer 320 may be first formed by the thin film deposition process without the shadow mask, and then, the second pattern layer 421 may be formed by the thin film deposition process using a shadow mask in-situ. That is, the second transparent electrode layer 320 and the second pattern layer 421 may be formed by a continuous process in-situ.

In this case, a content of indium of the second pattern layer 421 may be higher than a content of indium of the second transparent electrode layer 320, and a content of oxygen of the second pattern layer 421 may be lower than a content of oxygen of the second transparent electrode layer 320.

When a content of indium of the second pattern layer 421 is higher than a content of indium of the second transparent electrode layer 320 and a content of oxygen of the second pattern layer 421 is lower than a content of oxygen of the second transparent electrode layer 320, the electrical conductivity of the second pattern layer 421 may be better than that of the second transparent electrode layer 320, and thus, a contact resistance between the second transparent electrode layer 320 and the second seed layer 422 may be reduced.

Moreover, when a content of indium of the second transparent electrode layer 320 is lower than a content of indium of the second pattern layer 421 and a content of oxygen of the second transparent electrode layer 320 is higher than a content of oxygen of the second pattern layer 421, a light transmittance of the second transparent electrode layer 320 may be better than that of the second pattern layer 421, the amount of sunlight incident on the inside of a solar cell may increase.

The second seed layer 422 may be formed on the other surface (for example, a bottom surface) of the second pattern layer 421.

The second seed layer 422 may include a conductive material (for example, at least one selected from the group consisting of indium (In), tin (Sn), tantalum (Ta), and zinc (Zn)).

The second seed layer 422 is formed through a thin film deposition process such as a CVD process, an ALD process, or a PVD process. Also, the second seed layer 422 may be formed to have the same pattern as that of the second pattern layer 421 through the thin film deposition process using a shadow mask. In this case, the second seed layer 422 may be formed by a continuous process in-situ as the second pattern layer 421, and for the process efficiency of the continuous process, it may be preferable that the second seed layer 422 includes a material (for example, indium (In) or tin (Sn)) which is the same as a material included in the second pattern layer 421.

The second metal layer 423 may be formed on the other surface (for example, a bottom surface) of the second seed layer 422.

The second metal layer 423 may be formed of various metal materials known to those skilled in the art, and preferably, may include at least one selected from the group consisting of tungsten (W), aluminum (Al), and copper (Cu).

The second metal layer 423 is formed through a thin film deposition process such as a CVD process, an ALD process, or a PVD process. Also, the second metal layer 423 may be formed by the thin film deposition process using a shadow mask, or may be formed by a selective deposition process known to those skilled in the art without a shadow mask. In a case where the second metal layer 423 is formed by the thin film deposition process using a shadow mask, the second metal layer 423 may be formed by a continuous process in-situ as the second seed layer 422. The second metal layer 423 may be formed to have the same pattern as that of the second seed layer 422.

Depending on the case, the second seed layer 422 and the second metal layer 423 may be omitted, and in this case, the second electrode 420 may be formed of the second pattern layer 421.

Figure 2:
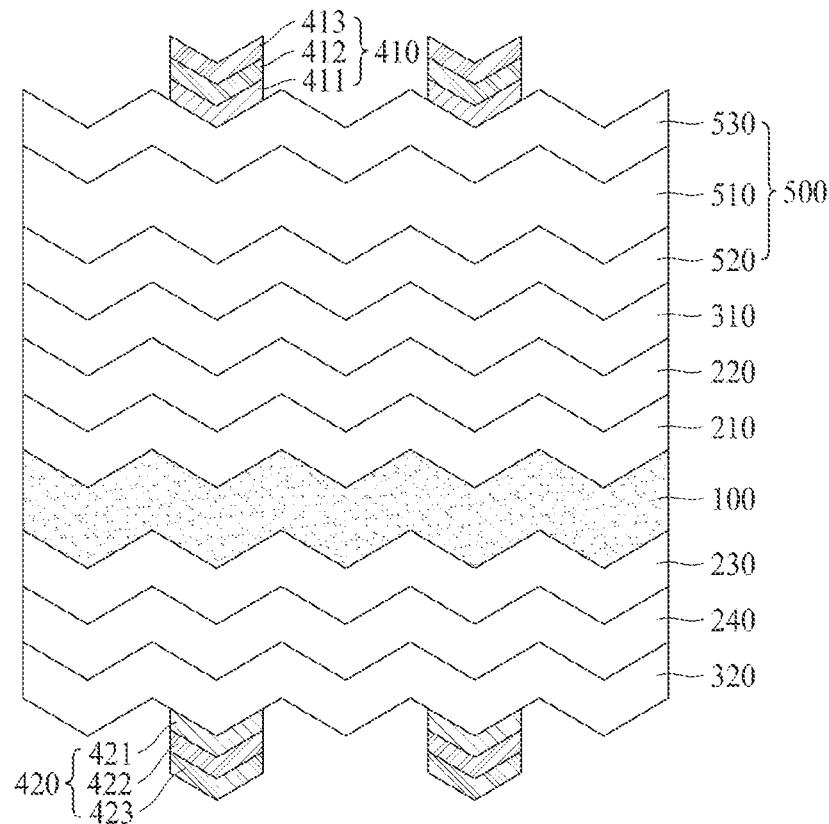
FIG. 2 is a cross-sectional view of a solar cell according to another embodiment of the present inventive concept.

FIG. 2 is a cross-sectional view of a solar cell according to another embodiment of the present inventive concept.

As seen in FIG. 2, the solar cell according to another embodiment of the present inventive concept includes a semiconductor substrate 100, a first semiconductor layer 210, a second semiconductor layer 220, a third semiconductor layer 230, a fourth semiconductor layer 240, a first transparent electrode layer 310, a second transparent electrode layer 320, a first electrode 410, a second electrode 420, and a perovskite solar cell 500.

Except for that the perovskite solar cell 500 is added, the solar cell according to another embodiment of the present inventive concept illustrated in FIG. 2 is the same as the solar cell according to FIG. 1 described above. Accordingly, like reference numerals refer to like elements, and only different elements willy be described below.

As seen in FIG. 2, according to another embodiment of the present inventive concept, the perovskite solar cell 500 is additionally formed between the first transparent electrode layer 310 and the first electrode 410 in a structure of FIG. 1 described above.

Therefore, the solar cell according to another embodiment of the present inventive concept may be a solar cell having a tandem structure including a bulk-type solar cell, which includes the semiconductor substrate 100, the first semiconductor layer 210, the second semiconductor layer 220, the third semiconductor layer 230, the fourth semiconductor layer 240, the first transparent electrode layer 310, and the second transparent electrode layer 320, and the perovskite solar cell 500 formed on the bulk-type sola cell.

In this case, the first transparent electrode layer 310 may function as a buffer layer between the bulk-type solar cell and the perovskite solar cell 500, and thus, a separate buffer layer is not needed.

The perovskite solar cell 500 may include conductive charge transporting layers 520 and 530 and a light absorption layer 510.

The perovskite solar cell 500 may include one or more conductive charge transporting layers 520 and 530. For example, the perovskite solar cell 500 may include a first conductive charge transporting layer 520 contacting the first transparent electrode layer 310 on the first transparent electrode layer 310, a light absorption layer 510 which is provided on the first conductive charge transporting layer 520, and a second conductive charge transporting layer 530 which is provided on the light absorption layer 510. However, the present inventive concept is not limited thereto, and the conductive charge transporting layers 520 and 530 may be disposed on only one surface of both surfaces of the light absorption layer 510.

The first conductive charge transporting layer 520 may be configured to have a polarity (for example, a p-type polarity) which differs from that of the second semiconductor layer 220, and the second conductive charge transporting layer 530 may be configured to have a polarity (for example, an n-type polarity) which differs from that of the first conductive charge transporting layer 520. Accordingly, the first conductive charge transporting layer 520 may be formed of a hole transporting layer (HTL), and the second conductive charge transporting layer 530 may be formed of an electron transporting layer (ETL).

The hole transporting layer may include various p-type organic materials such as Spiro-MeO-TAD, Spiro-TTB, polyaniline, polyphenol, poly(3,4-ethylenedioxythiophene)-poly(styrenesulfonate) (PEDOT-PSS), poly[bis(4-phenyl) (2,4,6-trimethylphenyl)amine] (PTAA), and poly(3-hexyl-thiophene-2,5-diyl) (P3HT) known to those skilled in the art, or may include a compound including various P-type organic or inorganic materials and various P-type metal oxides such as Ni oxide, Mo oxide, V oxide, W oxide, or Cu oxide known to those skilled in the art.

The electron transporting layer may include a compound including various N-type organic or inorganic materials and an N-type organic material, such as bathocuproine (BCP), C60, or phenyl-C61-butyric acid methyl ester (PCBM), or various N-type metal oxides such as ZnO, c-TiO$_2$/mp-TiO$_2$, SnO$_2$, or IZO known to those skilled in the art.

Furthermore, the second conductive charge transporting layer 530 may contact the first pattern layer 411 of the first electrode 410, and in this case, like that the first transparent electrode layer 310 and the first pattern layer 411 in FIG. 1 described above are formed by a continuous process in-situ, the second conductive charge transporting layer 530 and the first pattern layer 411 may be formed by a continuous process in-situ. To this end, the second conductive charge transporting layer 530 may be formed of transparent oxide (for example, ITO or SnO$_2$) including at least one of indium and tin. In this case, the second conductive charge transporting layer 530 is formed through a thin film deposition process such as a CVD process, an ALD process, or a PVD process.

However, although not shown, a third transparent electrode layer may be further formed between the second conductive charge transporting layer 530 and the first pattern layer 411, and thus, the third transparent electrode layer may contact the first pattern layer 411. In this case, like the first transparent electrode layer 310 described above, the third transparent electrode layer may be formed through a thin film deposition process such as a CVD process, an ALD process, or a PVD process and may be formed of transparent oxide (for example, ITO or SnO$_2$) including at least one of indium and tin. In this case, a content of indium of the first pattern layer 411 may be higher than a content of indium of the third transparent electrode layer, and a content of oxygen of the first pattern layer 411 may be lower than a content of oxygen of the third transparent electrode layer.

The light absorption layer 510 includes a perovskite compound known to those skilled in the art.

Figure 3:
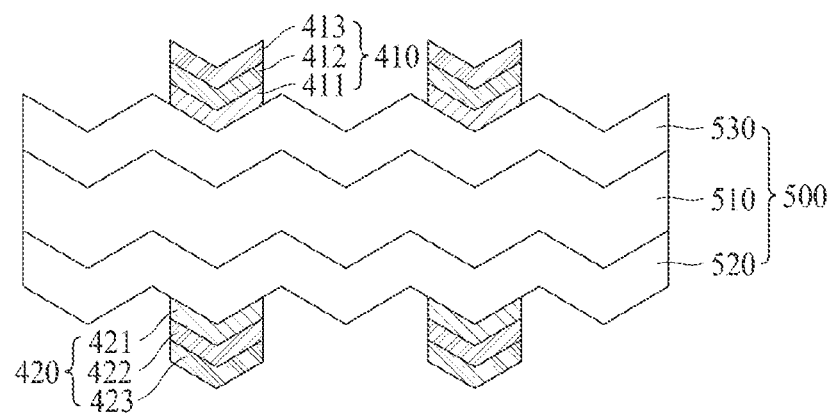
FIG. 3 is a cross-sectional view of a solar cell according to another embodiment of the present inventive concept.

FIG. 3 is a cross-sectional view of a solar cell according to another embodiment of the present inventive concept.

As seen in FIG. 3, the solar cell according to another embodiment of the present inventive concept includes a first electrode 410, a second electrode 420, and a perovskite solar cell 500.

The solar cell according to another embodiment of the present inventive concept illustrated in FIG. 3 has a structure where a bulk-type solar cell is removed from the solar cell of FIG. 2 described above and has a structure where the first electrode 410 is formed on one surface (for example, a top surface) of the perovskite solar cell 500 and the second electrode 420 is formed on the other surface (for example, a bottom surface) of the perovskite solar cell 500.

In this case, detailed configurations of the first electrode 410, the second electrode 420, and the perovskite solar cell 500 may be the same as the above description of FIG. 2.

Although not shown, a third transparent electrode layer may be further formed between a second conductive charge transporting layer 530 and a first pattern layer 411, and thus, the third transparent electrode layer may contact the first pattern layer 411. In this case, like the first transparent electrode layer 310 described above, the third transparent electrode layer may be formed through a thin film deposition process such as a CVD process, an ALD process, or a PVD process and may be formed of transparent oxide (for example, ITO or $SnO_2$) including at least one of indium and tin. Therefore, in this case, a content of indium of the first pattern layer 411 may be higher than a content of indium of the third transparent electrode layer, and a content of oxygen of the first pattern layer 411 may be lower than a content of oxygen of the third transparent electrode layer.

Furthermore, in FIG. 3, a second pattern layer 421 of the second electrode 420 contacts a first conductive charge transporting layer 520 of the perovskite solar cell 500. In this case, when the first conductive charge transporting layer 520 is not formed of transparent oxide (for example, ITO or $SnO_2$) including at least one of indium and tin, the first conductive charge transporting layer 520 and the second pattern layer 421 may not be formed by a continuous process. On the other hand, when the first conductive charge transporting layer 520 is formed of transparent oxide (for example, ITO or $SnO_2$) including at least one of indium and tin, the first conductive charge transporting layer 520 and the second pattern layer 421 may not be formed by a continuous process, and in this case, a content of indium of the second pattern layer 421 may be higher than a content of indium of the first conductive charge transporting layer 520, and a content of oxygen of the second pattern layer 421 may be lower than a content of oxygen of the first conductive charge transporting layer 520.

FIGS. 4A to 4D are cross-sectional views of a process of manufacturing a solar cell according to an embodiment of the present inventive concept and relate to a process of manufacturing the solar cell according to FIG. 1 described above. Hereinafter, a repeated description of the same element such as a material is omitted.

Figure 4A:
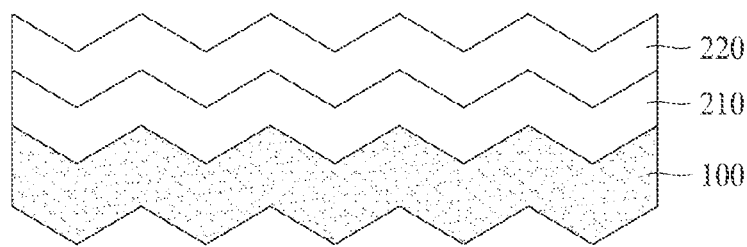
FIGS. 4A to 4D are cross-sectional views of a process of manufacturing a solar cell according to an embodiment of the present inventive concept.

First, as seen in FIG. 4A, a first semiconductor layer 210 is formed on one surface (for example, a top surface) of a semiconductor substrate 100, and a second semiconductor layer 220 is formed on one surface (for example, a top surface) of the first semiconductor layer 210.

The first semiconductor layer 210 may be formed of an intrinsic semiconductor layer (for example, an intrinsic amorphous silicon layer) or a semiconductor layer doped with a small amount of n-type dopant (for example, an amorphous silicon layer doped with a small amount of n-type dopant) through a thin film deposition process such as a chemical vapor deposition (CVD) process, an atomic layer deposition (ALD) process, or a physical vapor deposition (PVD) process.

The second semiconductor layer 220 may be formed of a semiconductor layer doped with an n-type dopant (for example, an amorphous silicon layer doped with an n-type dopant) through a thin film deposition process such as a chemical vapor deposition (CVD) process, an atomic layer deposition (ALD) process, or a physical vapor deposition (PVD) process.

In this case, the first semiconductor layer 210 and the second semiconductor layer 220 may be formed by a continuous process in-situ. In detail, the first semiconductor layer 210 including an intrinsic amorphous silicon layer may be formed by supplying a source material of silicon (Si) in a chamber through a chemical vapor deposition (CVD) process, an atomic layer deposition (ALD) process, or a physical vapor deposition (PVD) process, and subsequently, the second semiconductor layer 220 including an n-type amorphous silicon layer may be formed by additionally supplying an n-type dopant material together with the source material of Si through a chemical vapor deposition (CVD) process, an atomic layer deposition (ALD) process, or a physical vapor deposition (PVD) process.

Figure 4B:
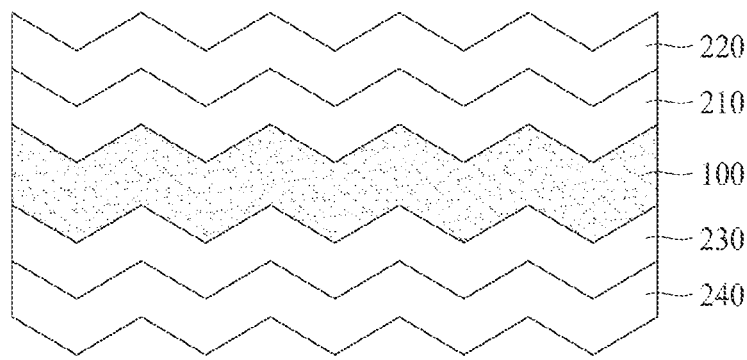

Subsequently, as seen in FIG. 4B, a third semiconductor layer 230 is formed on the other surface (for example, a bottom surface) of the semiconductor substrate 100, and a fourth semiconductor layer 240 is formed on the other surface (for example, a bottom surface) of the third semiconductor layer 230.

The third semiconductor layer 230 may be formed of an intrinsic semiconductor layer (for example, an intrinsic amorphous silicon layer) or a semiconductor layer doped with a small amount of p-type dopant (for example, an amorphous silicon layer doped with a small amount of p-type dopant) through a thin film deposition process such as a chemical vapor deposition (CVD) process, an atomic layer deposition (ALD) process, or a physical vapor deposition (PVD) process.

The fourth semiconductor layer 240 may be formed of a semiconductor layer doped with a p-type dopant (for example, an amorphous silicon layer doped with a p-type dopant) through a thin film deposition process such as a chemical vapor deposition (CVD) process, an atomic layer deposition (ALD) process, or a physical vapor deposition (PVD) process.

In this case, the third semiconductor layer 230 and the fourth semiconductor layer 240 may be formed by a continuous process in-situ. In detail, the third semiconductor layer 230 including an intrinsic amorphous silicon layer may be formed by supplying a source material of Si in a chamber through a chemical vapor deposition (CVD) process, an atomic layer deposition (ALD) process, or a physical vapor deposition (PVD) process, and subsequently, the fourth semiconductor layer 240 including a p-type amorphous silicon layer may be formed by additionally supplying a p-type dopant material together with the source material of Si through a chemical vapor deposition (CVD) process, an atomic layer deposition (ALD) process, or a physical vapor deposition (PVD) process.

Furthermore, a special order is not set between a process of FIG. 4A and a process of FIG. 4B. That is, the process of FIG. 4B may be first performed, and then, the process of FIG. 4A may be performed.

Figure 4C:
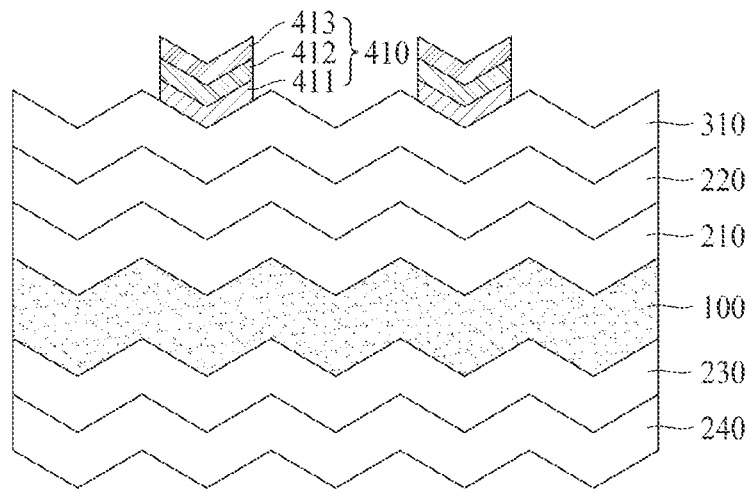

Subsequently, as seen in FIG. 4C, the first transparent electrode layer 310 is formed on one surface (for example, a top surface) of the second semiconductor layer 220, and a first electrode 410 is formed on one surface (for example, a top surface) of the first transparent electrode layer 310.

The first transparent electrode layer 310 may be formed of transparent oxide (for example, ITO or $SnO_2$) including at least one of indium and tin by using a chemical vapor deposition (CVD) process, an atomic layer deposition (ALD) process, or a physical vapor deposition (PVD) process.

A process of forming the first transparent electrode layer 310 may include a process of forming ITO by supplying a material including Sn, a material including oxygen (O), and a material including indium in a chamber, or may include a process of forming $SnO_2$ by supplying a material including Sn and a material including oxygen (O) in a chamber.

A process of forming the first electrode 410 may include a process of forming a first pattern layer 411, a process of forming a first seed layer 412 on a top surface of the first pattern layer 411, and a process of forming a first metal layer 413 on a top surface of the first seed layer 412.

The first pattern layer 411 may be formed of transparent oxide including at least one of indium and tin by using a chemical vapor deposition (CVD) process, an atomic layer deposition (ALD) process, or a physical vapor deposition (PVD) process with a shadow mask.

A process of forming the first pattern layer 411 may include a process of forming ITO by supplying a material including Sn, a material including oxygen (O), and a material including indium in a chamber, or may include a process of forming $SnO_2$ by supplying a material including Sn and a material including oxygen (O) in a chamber.

In this case, the first pattern layer 411 and the first transparent electrode layer 310 may be formed by a continuous process in-situ. For example, the first transparent electrode layer 310 may be formed by using a chemical vapor deposition (CVD) process, an atomic layer deposition (ALD) process, or a physical vapor deposition (PVD) process by supplying a material including Sn, a material including oxygen (O), and a material including indium in a chamber, and then, the first pattern layer 411 may be formed by using a chemical vapor deposition (CVD) process, an atomic layer deposition (ALD) process, or a physical vapor deposition (PVD) process with a shadow mask by supplying the material including Sn, the material including oxygen (O) having different content with respect to the first transparent electrode layer 310, and the material including indium having different content with respect to the first transparent electrode layer 310.

As another example, the first transparent electrode layer 310 may be formed by using a chemical vapor deposition (CVD) process, an atomic layer deposition (ALD) process, or a physical vapor deposition (PVD) process by supplying a material including Sn and a material including oxygen (O) in the same chamber, and then, the first pattern layer 411 may be formed by using a chemical vapor deposition (CVD) process, an atomic layer deposition (ALD) process, or a physical vapor deposition (PVD) process with a shadow mask by supplying the material including Sn, the material including oxygen (O), and a material including indium.

A ratio of an amount of supplying the material including indium to an amount of supplying all materials in a process of forming the first pattern layer 411 may be higher than a ratio of an amount of supplying the material including indium to an amount of supplying all materials in a process of forming the first transparent electrode layer 310, and a ratio of an amount of supplying the material including oxygen (O) to an amount of supplying all materials in a process of forming the first pattern layer 411 may be lower than a ratio of an amount of supplying the material including oxygen (O) to an amount of supplying all materials in a process of forming the first transparent electrode layer 310. Accordingly, a content of indium of the first pattern layer 411 may be higher than a content of indium of the first transparent electrode layer 310 and a content of oxygen of the first pattern layer 411 may be lower than a content of oxygen of the first transparent electrode layer 310, and thus, the electrical conductivity of the first pattern layer 411 may increase.

The first seed layer 412 may be formed by supplying a conductive material (for example, at least one selected from the group consisting of indium (In), tin (Sn), tantalum (Ta), and zinc (Zn)) by using a chemical vapor deposition (CVD) process, an atomic layer deposition (ALD) process, or a physical vapor deposition (PVD) process with a shadow mask.

In this case, the first seed layer 412 may be formed by a continuous process with a shadow mask in-situ as the first pattern layer 411.

The first metal layer 413 is formed through a thin film deposition process such as a chemical vapor deposition (CVD) process, an atomic layer deposition (ALD) process, or a physical vapor deposition (PVD) process. In this case, the first metal layer 413 may be formed by the thin film deposition process using a shadow mask, or may be formed by a selective deposition process known to those skilled in the art without a shadow mask. In a case where the first metal layer 413 is formed by the thin film deposition process using a shadow mask, the first metal layer 413 may be formed by a continuous process in-situ as the first seed layer 412.

The first metal layer 413 may be formed of various metal materials known to those skilled in the art, and preferably, may include at least one selected from the group consisting of tungsten (W), aluminum (Al), and copper (Cu).

Figure 4D:
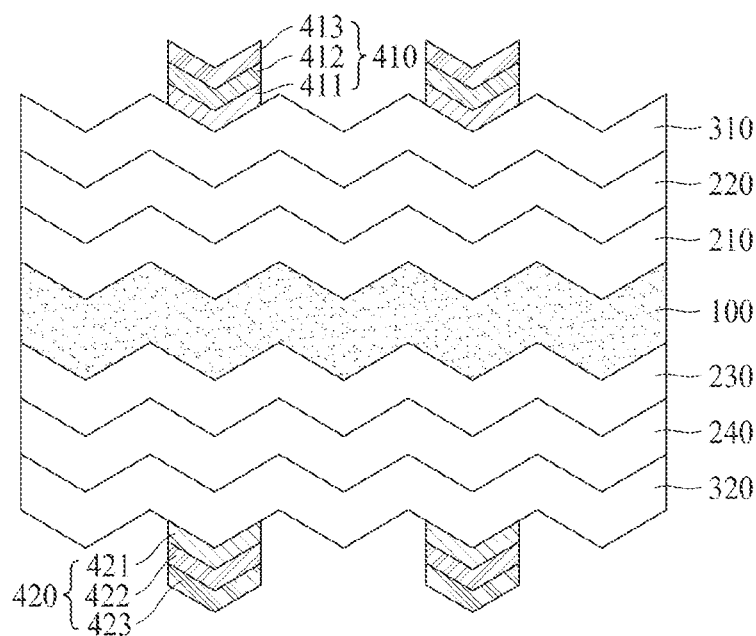

Subsequently, as seen in FIG. 4D, the second transparent electrode layer 320 is formed on the other surface (for example, a bottom surface) of the fourth semiconductor layer 240, and a second electrode 420 is formed on the other surface (for example, a bottom surface) of the second transparent electrode layer 320.

The second transparent electrode layer 320 may be formed of transparent oxide (for example, ITO or $SnO_2$) including at least one of indium and tin by using a chemical vapor deposition (CVD) process, an atomic layer deposition (ALD) process, or a physical vapor deposition (PVD) process.

A process of forming the second transparent electrode layer 320 may include a process of forming ITO by supplying a material including Sn, a material including oxygen (O), and a material including indium in a chamber, or may include a process of forming $SnO_2$ by supplying a material including Sn and a material including oxygen (O) in a chamber.

A process of forming the second electrode 420 may include a process of forming a second pattern layer 421, a process of forming a second seed layer 422 on a bottom surface of the second pattern layer 421, and a process of forming a second metal layer 423 on a bottom surface of the second seed layer 422.

The second pattern layer 421 may be formed of transparent oxide including at least one of indium and tin by using a chemical vapor deposition (CVD) process, an atomic layer deposition (ALD) process, or a physical vapor deposition (PVD) process with a shadow mask.

A process of forming the second pattern layer 421 may include a process of forming ITO by supplying a material including Sn, a material including oxygen (O), and a material including indium in a chamber, or may include a process of forming $SnO_2$ by supplying a material including Sn and a material including oxygen (O) in a chamber.

In this case, the second pattern layer 421 and the second transparent electrode layer 320 may be formed by a continuous process in-situ. For example, the second transparent electrode layer 320 may be formed by using a chemical vapor deposition (CVD) process, an atomic layer deposition (ALD) process, or a physical vapor deposition (PVD) process by supplying a material including Sn, a material including oxygen (O), and a material including indium in a chamber, and then, the second pattern layer 421 may be formed by using a chemical vapor deposition (CVD) process, an atomic layer deposition (ALD) process, or a physical vapor deposition (PVD) process with a shadow mask by supplying the material including Sn, the material including oxygen (O) having different content with respect to the second transparent electrode layer 320 and the material including indium having different content with respect to the second transparent electrode layer 320.

As another example, the second transparent electrode layer 320 may be formed by using a chemical vapor deposition (CVD) process, an atomic layer deposition (ALD) process, or a physical vapor deposition (PVD) process by supplying a material including Sn and a material including oxygen (O) in the same chamber, and then, the second pattern layer 421 may be formed by using a chemical vapor deposition (CVD) process, an atomic layer deposition (ALD) process, or a physical vapor deposition (PVD) process with a shadow mask by supplying the material including Sn, the material including oxygen (O), and a material including indium.

A ratio of an amount of supplying the material including indium to an amount of supplying all materials in a process of forming the second pattern layer 421 may be higher than a ratio of an amount of supplying the material including indium to an amount of supplying all materials in a process of forming the second transparent electrode layer 320, and a ratio of an amount of supplying the material including oxygen (O) to an amount of supplying all materials in a process of forming the second pattern layer 421 may be lower than a ratio of an amount of supplying the material including oxygen (O) to an amount of supplying all materials in a process of forming the second transparent electrode layer 320. Accordingly, a content of indium of the second pattern layer 421 may be higher than a content of indium of the second transparent electrode layer 320 and a content of oxygen of the second pattern layer 421 may be lower than a content of oxygen of the second transparent electrode layer 320, and thus, the electrical conductivity of the second pattern layer 421 may increase.

The second seed layer 422 may be formed by supplying a conductive material (for example, at least one selected from the group consisting of indium (In), tin (Sn), tantalum (Ta), and zinc (Zn)) by using a chemical vapor deposition (CVD) process, an atomic layer deposition (ALD) process, or a physical vapor deposition (PVD) process with a shadow mask.

In this case, the second seed layer 422 may be formed by a continuous process using a shadow mask in-situ as the second pattern layer 421.

The second metal layer 423 is formed through a thin film deposition process such as a chemical vapor deposition (CVD) process, an atomic layer deposition (ALD) process, or a physical vapor deposition (PVD) process. In this case, the second metal layer 423 may be formed by the thin film deposition process using a shadow mask, or may be formed by a selective deposition process known to those skilled in the art without a shadow mask. In a case where the second metal layer 423 is formed by the thin film deposition process using a shadow mask, the second metal layer 423 may be formed by a continuous process in-situ as the second seed layer 422.

The second metal layer 423 may be formed of various metal materials known to those skilled in the art, and preferably, may include at least one selected from the group consisting of tungsten (W), aluminum (Al), and copper (Cu).

Furthermore, a special order is not set between a process of FIG. 4C and a process of FIG. 4D. That is, the process of FIG. 4D may be first performed, and then, the process of FIG. 4C may be performed.

Depending on the case, the process of FIG. 4C may be performed after the process of FIG. 4A, and then, the process of FIG. 4B and the process of FIG. 4D may be continuously performed.

FIGS. 5A to 5D are cross-sectional views of a process of manufacturing a solar cell according to another embodiment of the present inventive concept and relate to a process of manufacturing the solar cell according to FIG. 2 described above.

Figure 5A:
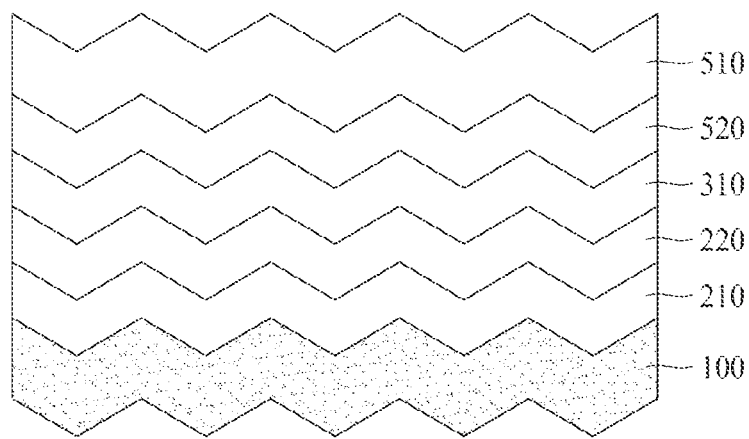
FIGS. 5A to 5D are cross-sectional views of a process of manufacturing a solar cell according to another embodiment of the present inventive concept.

First, as seen in FIG. 5A, a first semiconductor layer 210 is formed on one surface (for example, a top surface) of a semiconductor substrate 100, a second semiconductor layer 220 is formed on one surface (for example, a top surface) of the first semiconductor layer 210, a first transparent electrode layer 310 is formed on one surface (for example, a top surface) of the second semiconductor layer 220, a first conductive charge transporting layer 520 of a perovskite solar cell 500 is formed on one surface (for example, a top surface) of the first transparent electrode layer 310, and a light absorption layer 510 is formed on one surface (for example, a top surface) of the first conductive charge transporting layer 520.

A process of forming the first semiconductor layer 210, a process of forming the second semiconductor layer 220, and a process of forming the first transparent electrode layer 310 are as described above, and thus, repeated descriptions thereof are omitted.

A process of forming the first conductive charge transporting layer 520 may include a process of forming a hole transporting layer (HTL) including an organic material through a thin film deposition process such as an evaporation process, or may include a process of forming a hole transporting layer (HTL) including an inorganic material through a thin film deposition process such as a chemical vapor deposition (CVD) process, an atomic layer deposition (ALD) process, or a physical vapor deposition (PVD) process.

A process of forming the light absorption layer 510 may include a process of forming a perovskite compound through a solution process or a thin film deposition process such as a chemical vapor deposition (CVD) process.

Figure 5B:
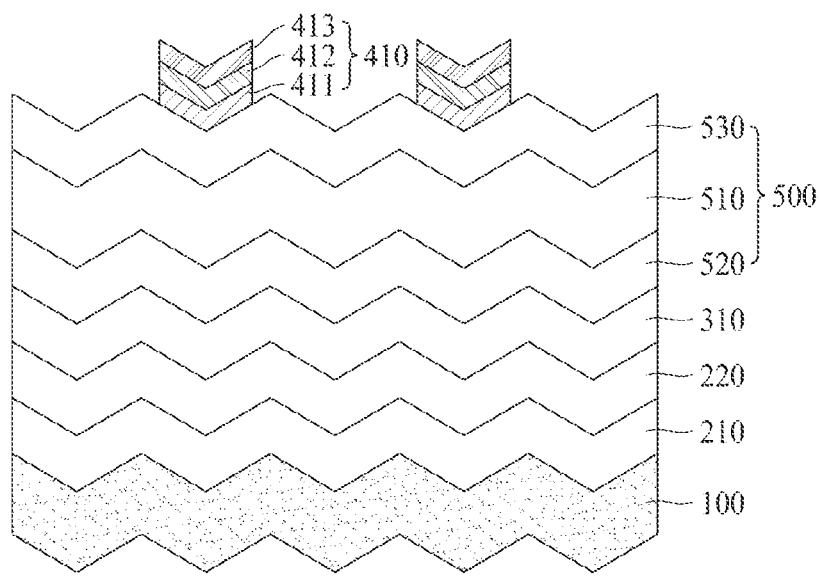

Subsequently, as seen in FIG. 5B, a second conductive charge transporting layer 530 is formed on one surface (for example, a top surface) of the light absorption layer 510 of the perovskite solar cell 500, and a first electrode 410 is formed on one surface (for example, a top surface) of the second conductive charge transporting layer 530.

A process of forming the second conductive charge transporting layer 530 may include a process of forming an electron transporting layer (ETL) including an inorganic material (particularly, transparent oxide including at least one of indium and tin, for example, ITO or $SnO_2$) through a thin film deposition process such as a chemical vapor deposition (CVD) process, an atomic layer deposition (ALD) process, or a physical vapor deposition (PVD) process.

A process of forming the first electrode 410 may include a process of forming a first pattern layer 411, a process of forming a first seed layer 412 on a top surface of the first pattern layer 411, and a process of forming a first metal layer 413 on a top surface of the first seed layer 412, and each process is as described above. However, the first pattern layer 411 is formed to contact the second conductive charge transporting layer 530, and thus, the first pattern layer 411 may be formed by a continuous process in-situ as the second conductive charge transporting layer 530.

However, although not shown, a third transparent electrode layer may be further formed between the second conductive charge transporting layer 530 and the first pattern layer 411, and thus, the third transparent electrode layer may contact the first pattern layer 411. In this case, like the first transparent electrode layer 310 described above, the third transparent electrode layer may be formed through a thin film deposition process such as a chemical vapor deposition (CVD) process, an atomic layer deposition (ALD) process, or a physical vapor deposition (PVD) process and may be formed of transparent oxide (for example, ITO or $SnO_2$) including at least one of indium and tin. Therefore, in this case, a content of indium of the first pattern layer 411 may be higher than a content of indium of the third transparent electrode layer, and a content of oxygen of the first pattern layer 411 may be lower than a content of oxygen of the third transparent electrode layer. Also, the first pattern layer 411 may be formed by a continuous process in-situ as the third transparent electrode layer.

Figure 5C:
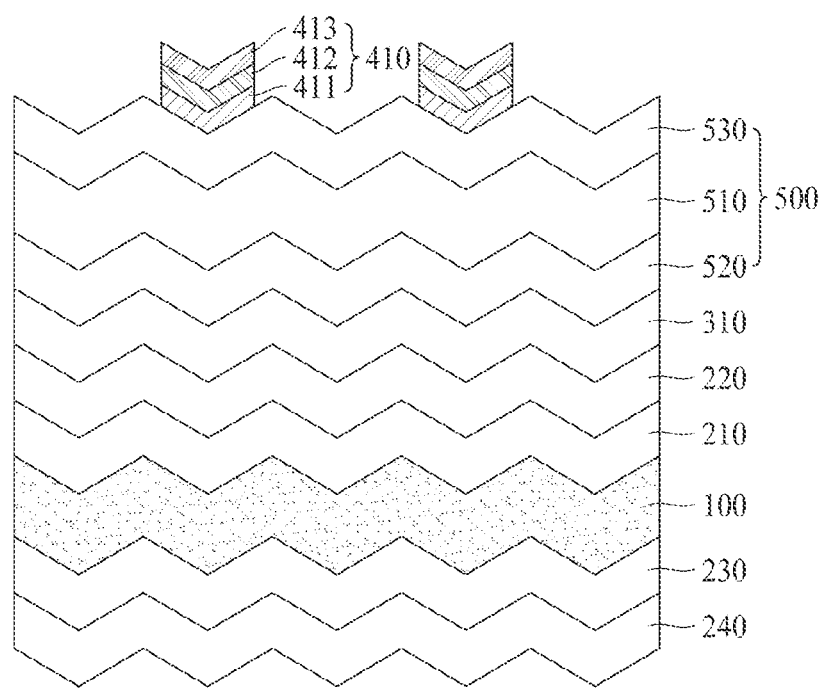

Subsequently, as seen in FIG. 5C, a third semiconductor layer 230 is formed on the other surface (for example, a bottom surface) of the semiconductor substrate 100, and a fourth semiconductor layer 240 is formed on the other surface (for example, a bottom surface) of the third semiconductor layer 230.

A process of forming the third semiconductor layer 230 and a process of forming the fourth semiconductor layer 240 are as described above, and thus, repeated descriptions thereof are omitted.

Figure 5D:
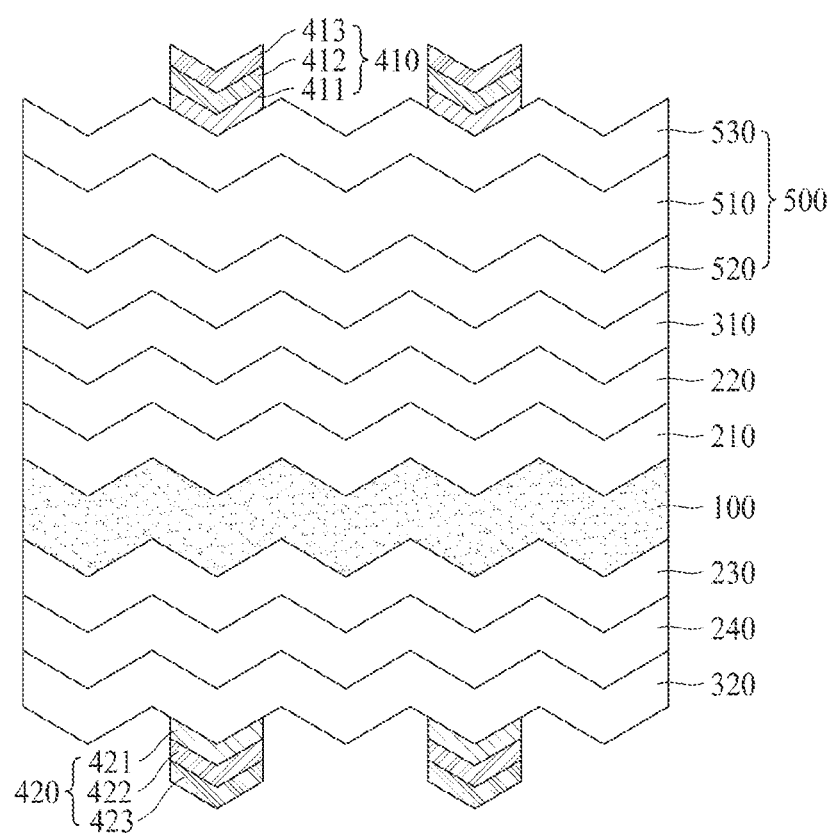

Subsequently, as seen in FIG. 5D, a second transparent electrode layer 320 is formed on the other surface (for example, a bottom surface) of the fourth semiconductor layer 240, and a second electrode 420 is formed on the other surface (for example, a bottom surface) of the second transparent electrode layer 320.

A process of forming the second transparent electrode layer 320 and a process of forming the second electrode 420 are as described above, and thus, repeated descriptions thereof are omitted.

Furthermore, although not shown, first, the first semiconductor layer 210 and the second semiconductor layer 220 may be sequentially formed on the top surface of the semiconductor substrate 100, and subsequently the third semiconductor layer 230 and the fourth semiconductor layer 240 may be sequentially formed on the bottom surface of the semiconductor substrate 100. And, the first transparent electrode layer 310 and the first electrode 410 may be sequentially formed on the top surface of the second semiconductor layer 220 subsequently, and the second transparent electrode layer 320 and the second electrode 420 may be sequentially formed on the bottom surface of the fourth semiconductor layer 240 subsequently. In this case, a configuration formed on the bottom surface of the semiconductor substrate 100 may be formed prior to a configuration formed on the top surface of the semiconductor substrate 100.

Hereinabove, the embodiments of the present inventive concept have been described in more detail with reference to the accompanying drawings, but the present inventive concept is not limited to the embodiments and may be variously modified within a range which does not depart from the technical spirit of the present inventive concept. Therefore, it should be understood that the embodiments described above are exemplary from every aspect and are not restrictive. It should be construed that the scope of the present inventive concept is defined by the below-described claims instead of the detailed description, and the meanings and scope of the claims and all variations or modified forms inferred from their equivalent concepts are included in the scope of the present inventive concept.

The invention claimed is:

1. A solar cell comprising:
a semiconductor substrate;
a first transparent electrode layer provided on one surface of the semiconductor substrate; and
a first electrode provided on one surface of the first transparent electrode layer,
wherein the first electrode comprises a first pattern layer patterned by a deposition process using a shadow mask,
wherein each of the first transparent electrode layer and the first pattern layer comprises transparent oxide including at least one of indium (In) and tin (Sn), and
wherein the first pattern layer contacts the first transparent electrode layer, and a content of indium of the first pattern layer is higher than a content of indium of the first transparent electrode layer.

2. The solar cell of claim 1, wherein a content of oxygen of the first pattern layer is lower than a content of oxygen of the first transparent electrode layer.

3. The solar cell of claim 1, wherein the first electrode further comprises a first seed layer provided on the first pattern layer and a first metal layer provided on the first seed layer, and
the first seed layer is patterned by a deposition process using a shadow mask, and the first metal layer is patterned by a selective deposition process.

4. The solar cell of claim 3, wherein the first pattern layer, the first seed layer, and the first metal layer have the same pattern.

5. The solar cell of claim 1, wherein a first semiconductor layer and a second semiconductor layer are further provided between the semiconductor substrate and the first transparent electrode layer,
the first semiconductor layer is formed of an intrinsic amorphous silicon layer, and
the second semiconductor layer is formed of an n-type amorphous silicon layer.

6. A solar cell comprising:
a perovskite solar cell including a first conductive charge transporting layer, a light absorption layer provided on the first conductive charge transporting layer, and a second conductive charge transporting layer provided on the light absorption layer; and
a first electrode provided on one surface of the second conductive charge transporting layer,
wherein the first electrode comprises a first pattern layer patterned by a deposition process using a shadow mask,
further comprising a third transparent electrode layer provided between the second conductive charge transporting layer and the first pattern layer,
wherein each of the third transparent electrode layer and the first pattern layer comprises transparent oxide including at least one of indium (In) and tin (Sn), and
wherein the first pattern layer contacts the third transparent electrode layer, a content of indium of the first pattern layer is higher than a content of indium of the third transparent electrode layer.

7. The solar cell of claim 6, wherein a content of oxygen of the first pattern layer is lower than a content of oxygen of the third transparent electrode layer.

8. A method of manufacturing a solar cell, the method comprising:
   a step of forming a first transparent electrode layer on one surface of a semiconductor substrate; and
   a step of forming a first electrode on one surface of the first transparent electrode layer,
   wherein the step of forming the first electrode comprises a process of forming a first pattern layer through a deposition process using a shadow mask, and
   the first transparent electrode layer and the first pattern layer are formed by a continuous process in-situ,
   wherein each of the first transparent electrode layer and the first pattern layer comprises transparent oxide including at least one of indium (In) and tin (Sn), and
   wherein the first pattern layer contacts the first transparent electrode layer, and a content of indium of the first pattern layer is higher than a content of indium of the first transparent electrode layer.

9. The method of claim 8, wherein a process of forming the first transparent electrode layer and the first pattern layer through a continuous process in-situ comprises a process of forming the first transparent electrode layer by supplying a material including Sn, a material including oxygen, and a material including indium in the same chamber, and then, forming the first pattern layer with the shadow mask by supplying the material including Sn, the material including oxygen (O), and the material including indium.

10. The method of claim 9, wherein a ratio of an amount of supplying the material including indium to an amount of supplying all materials in the process of forming the first pattern layer is higher than a ratio of an amount of supplying the material including indium to an amount of supplying all materials in the process of forming the first transparent electrode layer, and
   a ratio of an amount of supplying the material including oxygen to an amount of supplying all materials in the process of forming the first pattern layer is lower than a ratio of an amount of supplying the material including oxygen to an amount of supplying all materials in the process of forming the first transparent electrode layer.

11. The method of claim 8, wherein a process of forming the first transparent electrode layer and the first pattern layer through a continuous process in-situ comprises a process of forming the first transparent electrode layer by supplying a material including Sn and a material including oxygen in the same chamber, and then, forming the first pattern layer with the shadow mask by supplying the material including Sn, the material including oxygen (O), and a material including indium.

12. A method of manufacturing a solar cell, the method comprising:
   a step of forming a perovskite solar cell on one surface of a semiconductor substrate, the perovskite solar cell including a first conductive charge transporting layer, a light absorption layer provided on the first conductive charge transporting layer, and a second conductive charge transporting layer provided on the light absorption layer; and
   a step of forming a third transparent electrode layer on one surface of the second conductive charge transporting layer; and
   a step of forming a first electrode on one surface of the third transparent electrode layer,
   wherein the step of forming the first electrode comprises a process of forming a first pattern layer through a deposition process using a shadow mask, and
   the third transparent electrode layer and the first pattern layer are formed by a continuous process in-situ,
   wherein each of the third transparent electrode layer and the first pattern layer comprises transparent oxide including at least one of indium (In) and tin (Sn), and
   wherein the first pattern layer contacts the third transparent electrode layer, a content of indium of the first pattern layer is higher than a content of indium of the third transparent electrode layer.

13. The method of claim 12, wherein the step of forming the first electrode comprises a process of forming a first seed layer on the first pattern layer and a process of forming a first metal layer on the first seed layer,
   the first seed layer is patterned by a deposition process using a shadow mask, and
   the first metal layer is patterned by a selective deposition process.

14. The solar cell of claim 6, further comprising a semiconductor substrate under the perovskite solar cell and a first transparent electrode layer between the semiconductor substrate and the perovskite solar cell.

* * * * *